(12) United States Patent
Fan et al.

(10) Patent No.: US 12,279,422 B2
(45) Date of Patent: Apr. 15, 2025

(54) METHOD OF MANUFACTURING NON-VOLATILE MEMORY DEVICE

(71) Applicant: IOTMEMORY TECHNOLOGY INC., Taipei (TW)

(72) Inventors: Der-Tsyr Fan, Taoyuan (TW); I-Hsin Huang, Taoyuan (TW); Chen-Ming Tsai, Miaoli County (TW); Yu-Ming Cheng, Yilan County (TW)

(73) Assignee: IOTMEMORY TECHNOLOGY INC., Taipei (TW)

( * ) Notice: Subject to any disclaimer, the term of this patent is extended or adjusted under 35 U.S.C. 154(b) by 571 days.

(21) Appl. No.: 17/578,414

(22) Filed: Jan. 18, 2022

(65) Prior Publication Data
US 2023/0232623 A1 Jul. 20, 2023

(51) Int. Cl.
*H10B 41/30* (2023.01)
*H10B 41/10* (2023.01)

(52) U.S. Cl.
CPC ............. *H10B 41/30* (2023.02); *H10B 41/10* (2023.02)

(58) Field of Classification Search
CPC ........ H10B 41/30; H10B 41/10; H10B 41/44; H10B 41/70; H10D 64/035; H10D 64/01; H10D 30/6892; H10D 30/685; H10D 30/681
See application file for complete search history.

(56) References Cited

U.S. PATENT DOCUMENTS

| | | | |
|---|---|---|---|
| 8,530,950 B1 | 9/2013 | Kang | |
| 2005/0006691 A1 | 1/2005 | Wu | |
| 2007/0257299 A1 | 11/2007 | Chen | |
| 2012/0295413 A1 | 11/2012 | Fujii | |
| 2013/0026552 A1 | 1/2013 | Toh | |
| 2013/0112935 A1 | 5/2013 | Himeno | |
| 2014/0042383 A1 | 2/2014 | Inokuma | |
| 2016/0225777 A1* | 8/2016 | Cheng | ................. H01L 29/7885 |
| 2016/0336415 A1 | 11/2016 | Wu | |
| 2016/0358928 A1 | 12/2016 | Wu | |
| 2016/0365350 A1 | 12/2016 | Chuang | |

(Continued)

FOREIGN PATENT DOCUMENTS

| | | |
|---|---|---|
| JP | 7-106446 A | 4/1995 |
| JP | 11-111866 A | 4/1999 |

(Continued)

*Primary Examiner* — Latanya N Crawford Eason
(74) *Attorney, Agent, or Firm* — Winston Hsu

(57) ABSTRACT

A method of manufacturing a non-volatile memory includes the following steps. A stacked structure is formed on a substrate and includes a gate dielectric layer, an assist gate, an insulation layer, and a sacrificial layer stacked in order. A tunneling dielectric layer is formed at one side of the stacked structure. A floating gate is formed on the tunneling dielectric layer. The stacked structure is etched until an uppermost edge of the floating gate is higher than a top surface of the insulation layer. A dielectric material layer is formed to cover sidewalls of the floating gate. The dielectric material layer is etched to form an etched dielectric material layer and expose the uppermost edge of the floating gate. An upper gate structure is formed on the etched dielectric material layer, where a portion of the etched dielectric material layer is disposed between the upper gate structure and the substrate.

20 Claims, 15 Drawing Sheets

(56) References Cited

U.S. PATENT DOCUMENTS

| | | | |
|---|---|---|---|
| 2017/0040334 A1* | 2/2017 | Cheng | ............ H10B 41/35 |
| 2020/0251480 A1 | 8/2020 | Jang | |
| 2021/0066324 A1 | 3/2021 | Cai | |
| 2021/0358927 A1 | 11/2021 | Wang | |
| 2021/0408119 A1 | 12/2021 | Himeno | |
| 2022/0293614 A1 | 9/2022 | Cai | |
| 2022/0293756 A1 | 9/2022 | Xing | |

FOREIGN PATENT DOCUMENTS

| | | |
|---|---|---|
| JP | 2014-96421 A | 5/2014 |
| RU | 2 297 625 C1 | 4/2007 |
| TW | 200729514 | 8/2007 |
| TW | 201508753 A | 3/2015 |
| TW | M513458 U | 12/2015 |
| TW | 202018917 A | 5/2020 |
| TW | 202114174 A | 4/2021 |
| TW | 202236627 A | 9/2022 |
| WO | 2020/179199 A1 | 9/2020 |
| WO | 2022/191864 A1 | 9/2022 |

* cited by examiner

METHOD OF MANUFACTURING NON-VOLATILE MEMORY DEVICE

BACKGROUND OF THE INVENTION

1. Field of the Invention

The invention relates to a method of manufacturing a semiconductor device. More particularly, the invention relates to a method of manufacturing a non-volatile memory device and a non-volatile memory device manufactured by the same.

2. Description of the Prior Art

Since a non-volatile memory can, for instance, repeatedly perform operations such as storing, reading, and erasing data, and since stored data is not lost after the non-volatile memory is shut down, the non-volatile memory has been extensively applied in personal computers and electronic equipment.

A traditional structure of non-volatile memory has a stack-gate structure, including a tunneling oxide layer, a floating gate, an inter-gate dielectric layer, and a control gate disposed on a substrate in order. When a programming or erasing operation is performed on such a flash memory device, a suitable voltage is respectively applied to the source region, the drain region, and the control gate, such that electrons are injected into a floating gate, or electrons are pulled out from the floating gate.

In the programming and erasing operation of the non-volatile memory, a greater gate-coupling ratio (GCR) between the floating gate and the control gate generally means a lower operating voltage is needed for the operation, and the operating speed and the efficiency of the flash memory are significantly increased as a result. However, during programming or erase operations, electrons have to be injected into or pulled out of the floating gate through a tunneling oxide layer disposed under the floating gate, which often causes damages to the structure of the tunneling oxide layer and thus reduces the reliability of the memory device.

In order to increase the reliability of the memory device, an erase gate is adopted and incorporated into to the memory device, which is capable of pulling the electrons from the floating gate by applying a positive voltage to the erase gate. Thus, since the electrons in the floating gate is pulled out through a tunneling oxide layer disposed on the floating gate rather than through the tunneling oxide layer disposed under the floating gate, the reliability of the memory device is further improved.

With an increasing demand for high-efficient memory device, there is still a need to provide an improved memory device and its manufacturing method which is capable of erasing the stored data efficiently.

SUMMARY OF THE INVENTION

The invention provides a method of manufacturing a non-volatile memory device and a non-volatile memory device manufactured by the method. The non-volatile memory device is capable of erasing the stored data efficiently and in a low erasing voltage.

According to some embodiments of the present disclosure, a method of manufacturing a non-volatile memory device includes the following steps. A stacked structure is formed on a substrate and includes a gate dielectric layer, an assist gate, an insulation layer, and a sacrificial layer stacked in order. A tunneling dielectric layer is formed on the substrate at one side of the stacked structure. A floating gate is formed on the tunneling dielectric layer. The stacked structure is etched until an uppermost edge of the floating gate is higher than a top surface of the insulation layer. A dielectric material layer is formed to cover sidewalls of the floating gate. The dielectric material layer is etched to form an etched dielectric material layer and expose the uppermost edge of the floating gate. An upper gate structure is formed on the etched dielectric material layer, where a portion of the etched dielectric material layer is disposed between the upper gate structure and the substrate.

According to some embodiments of the present disclosure, a non-volatile memory device includes at least one stacked gate structure, a tunneling dielectric layer, and at least one floating gate. The stacked gate structure is disposed on a substrate and includes a gate dielectric layer, an assist gate, and an upper gate structure stacked in order. The tunneling dielectric layer is disposed on the substrate at one side of the stacked gate structure. The floating gate is disposed on the tunneling dielectric layer and includes an uppermost edge, a curved sidewall, and two lateral sidewalls. The uppermost edge of the floating gate is embedded in the upper gate structure. The bottom surface of the upper gate structure extending beyond the lateral sidewall of the floating gate is spaced apart from the tunneling dielectric layer. To further optimize the operation of the non-volatile memory device described in the embodiments of the present disclosure, an extra middle gate may be disposed to increase the gate coupling to the floating gate.

By using the non-volatile memory device according to the embodiments of the present disclosure, the erase voltage applied to the device can be reduced, which means that electrons can be effectively pulled out of the floating gate, and as a result the speed of erasing data is increased.

In order to make the aforementioned features and advantages of the disclosure more comprehensible, embodiments accompanied with figures are described in detail below.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
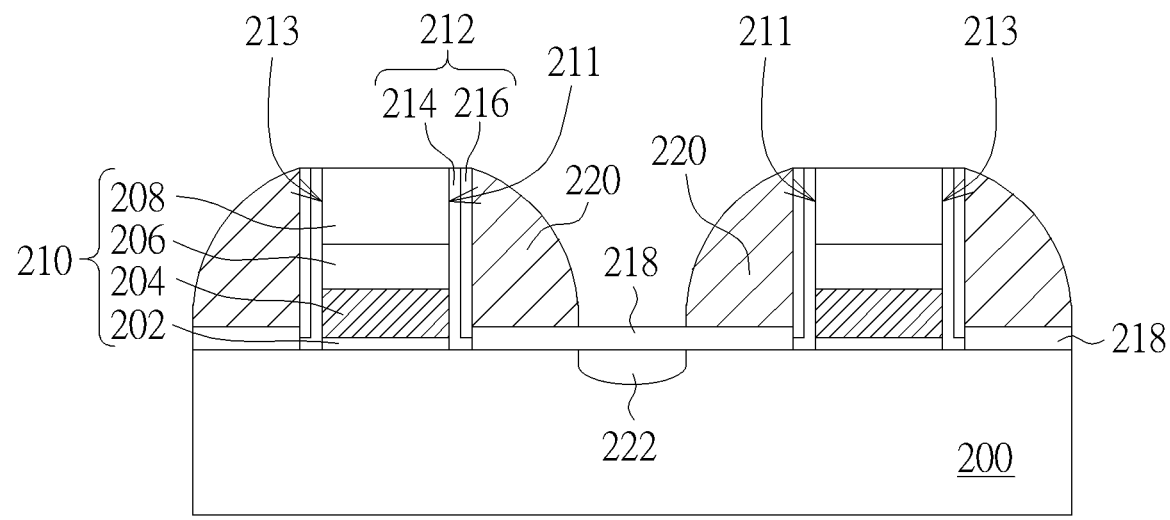
FIG. 1 is a schematic cross-sectional view illustrating a structure including stacked structures and conductive spacers at a stage of a method for fabricating a non-volatile memory device according to some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "on", "over", "above", "upper", "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

Although the disclosure is described with respect to specific embodiments, the principles of the disclosure, as defined by the claims appended herein, may obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

FIG. 1 is a schematic cross-sectional view illustrating a structure including stacked structures and conductive spacers at a stage of a method for fabricating a non-volatile memory device according to some embodiments of the present disclosure. Referring to FIG. 1, a structure formed at this manufacturing stage includes at least a substrate 200, at least one stacked structure 210, an isolation material layer 212, a tunneling dielectric layer 218, a conductive spacer 220, and a source region 222.

According to some embodiments of the present disclosure, the substrate 200 may be a semiconductor substrate with suitable conductivity type, such as p-type or n-type. The composition of the substrate 200 may include silicon, germanium, gallium nitride or other suitable semiconductor materials, but not limited thereto.

At least one stacked structure 210 is on the substrate 200. For example, two stacked structures 210 are disposed on the substrate 200 and laterally spaced apart from each other.

Each of the stacked structures 210 includes a gate dielectric layer 202, an assist gate 204, an insulation layer 206, and a sacrificial layer 208 stacked in order. Each of the stacked structures 210 include a first sidewall 211 and a second sidewall 211, and the first sidewalls 211 of the stacked structures 210 faces toward each other. The assist gate 204 is made of conductive material, and the assist gate 204 is configured to turn on/off of a carrier channel in the substrate 200 underlying the assist gate 204 when applied with a suitable voltage. The insulation layer 206 is made of insulating material, such as silicon oxide, silicon oxide, or silicon oxynitride, but not limited thereto, which is used to electrically isolate the assist gate 204 from layers disposed above the assist gate 204. The sacrificial layer 208 is an uppermost layer in the stacked structure 210, which is a temporary layer configured to be removed before the subsequent process of forming a gate structure, such as an upper gate structure, on the assist gate 204.

The isolation material layer 212 is formed on the sidewalls 211, 213 of the stacked structures 210. The material of the isolation material layer 212 is, for instance, silicon oxide/silicon nitride/silicon oxide or silicon nitride/silicon oxide. The forming method of the isolation material layer 212 includes, for instance, first forming a dielectric layer 214 and a dielectric layer 216 covering each of the stacked structures 210 on the substrate 200 in order, and then removing a portion of the dielectric layer 214 and the dielectric layer 216 to form the isolation material layer 212 on the sidewall of each of the stacked structures 210. The material of the dielectric layer 214 is, for instance, silicon nitride, and the material of the dielectric layer 216 is, for instance, silicon oxide. The forming method of the dielectric layer 214 and the dielectric layer 216 is, for instance, a chemical vapor deposition method. The method of removing a portion of the dielectric layer 214 and the dielectric layer 216 is, for instance, an anisotropic etching method.

The tunneling dielectric layer 218 is formed on the substrate 200 at least between the stacked structures 210 or further at both sides of the stacked structures 210. The material of the tunneling dielectric layer 218 is, for instance, silicon oxide, or other layers that allow hot electrons pass through it by tunneling effect. The forming method of the tunneling dielectric layer 218 is, for instance, a thermal oxidation or deposition method, but not limited thereto.

The conductive spacer 220 is formed on the sidewall 211, 213 of each of the stacked structures 210. The method of forming the conductive spacer 220 may include the following steps. First, a conductive layer (not shown) is formed on the substrate 200. The material of the conductive layer is, for instance, doped polysilicon, polycide or other suitable conductive material. When the material of the conductive layer is doped polysilicon, its forming method includes, for instance, performing an ion implantation step after an undoped polysilicon layer is formed via a chemical vapor deposition method; or performing a chemical vapor deposition method with an in-situ dopant implantation method. Then, an etching process, such as an anisotropic etching process or an etch-back process, is performed to etch the conductive layer. As a result, a portion of the tunneling dielectric layer 218 between the stacked structures 210 is exposed and the conductive spacer 220 is formed.

Afterwards, a source region 222 is formed in the substrate 200 between the conductive spacers 220 disposed on the first sidewalls 211 of the stacked structures 210. The method of forming the source region 222 includes, for instance, performing an ion implantation process by using the conductive spacers 220 as a mask. The implanted dopant can be an n-type or p-type dopant as decided according to the requirements of the device. The source region 222 may be regarded as a shared source region since the source region 222 is shared by two adjacent memory cells each including at least the stacked structure 210 and the conductive spacer 220.

Figure 2:
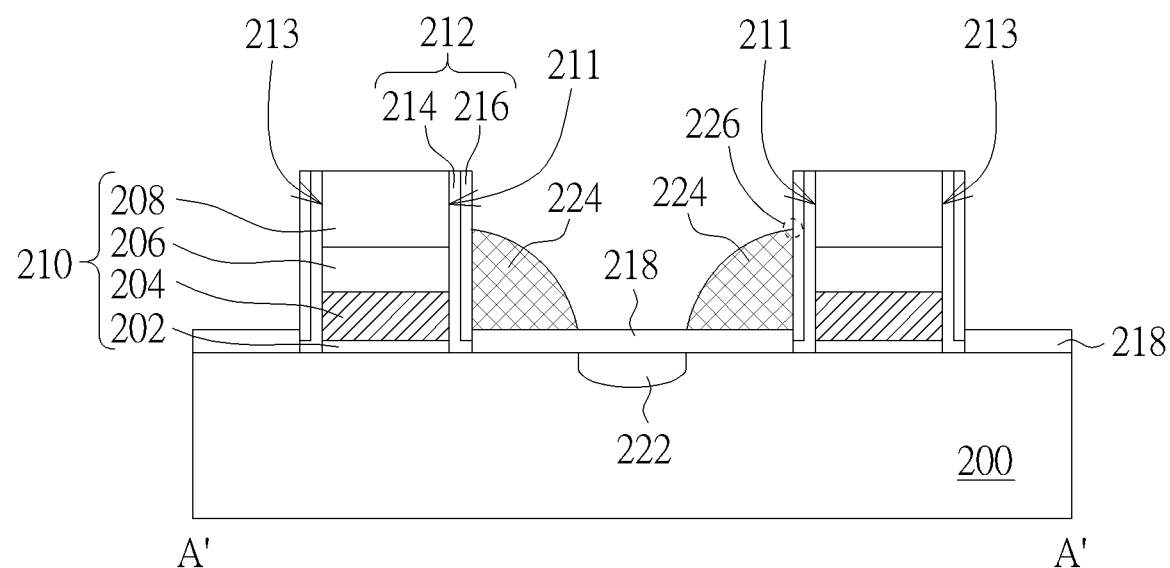
FIG. 2 is a schematic cross-sectional view illustrating a structure including floating gates on the sidewalls of stacked structures at a stage of a method for fabricating a non-volatile memory device according to some embodiments of the present disclosure.

FIG. 2 is a schematic cross-sectional view illustrating a structure including floating gates on the sidewalls of stacked structures at a stage of a method for fabricating a non-volatile memory device according to some embodiments of the present disclosure. Referring to FIG. 2, the conductive spacer 220 is patterned and/or trimmed to form a floating gate 224. The method of patterning the conductive spacer 220 is as follows. A patterned photoresist layer (not shown) is formed on the substrate 200 to cover portions of the conductive spacer 220. Then, the conductive spacer 220 exposed from the patterned photoresist layer is removed completely so that only the conductive spacer 220 disposed on the first sidewall 211 of the stacked structure 210 remain. Besides, portions of the conductive spacer 220 disposed on the first sidewall 211 of the stacked structure 210 can be patterned to have a polygonal contour when viewed from a top-down perspective. Then, the patterned photoresist layer is removed. The height of the floating gate 224 can be properly controlled by performing a trimming process. According to some embodiments of the present disclosure, an uppermost edge 226 of the floating gate 224 is higher than a top surface of the assist gate 204, and higher than or slightly lower than the bottom surface of the sacrificial layer 208. A schematic top view corresponding to the structure shown in FIG. 2 is shown in FIG. 3.

Figure 3:
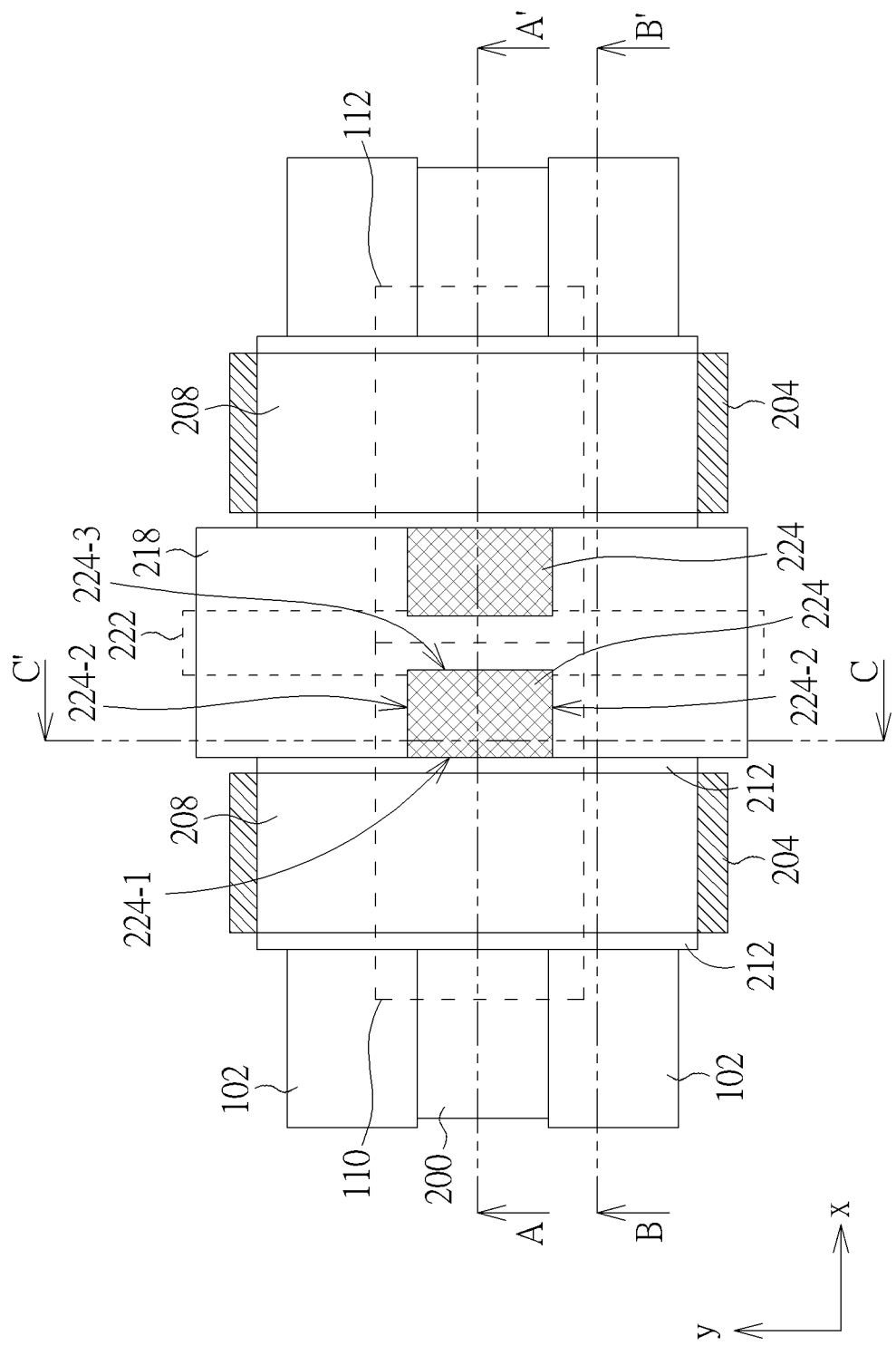
FIG. 3 is a schematic top view illustrating a structure including floating gates on the sidewalls of stacked structures at a stage of a method for fabricating a non-volatile memory device according to some embodiments of the present disclosure.

FIG. 3 is a schematic top view illustrating a structure including floating gates on the sidewalls of stacked structures at a stage of a method for fabricating a non-volatile memory device according to some embodiments of the present disclosure. FIG. 2 may correspond to a cross-sectional view taken along line A-A' in FIG. 3. Referring to FIG. 3, the substrate 200 between the isolation structures 102, such as shallow trench isolation structures, can act as an active region of a memory device, and the active region can extend in a first direction, such as an x-direction. The assist gate 204 and the sacrificial layer 208, both of which are components of the stacked structure 210, and the source region 222 can extend in a second direction, such as a y-direction, perpendicular to the first direction. At least one floating gate, such as two floating gates 224, is disposed between two adjacent assist gates 204. Each of the floating gates 224 includes an inner sidewall 224-1 facing toward a sidewall of the isolation material layer 212, a lateral sidewall 224-2, and a curved sidewall 224-3 connected to the edges of the inner sidewall 224-1 and the lateral sidewall 224-2. According to some embodiments of the present disclosure, the top view of the FIG. 3 include at least two memory cell regions, such as a first memory cell region 110 and a second memory cell region 112. The first and second memory cell regions 110, 112 can be used to accommodate memory cells respectively, and the two memory cells can be mirror symmetric to each other.

Figure 4:
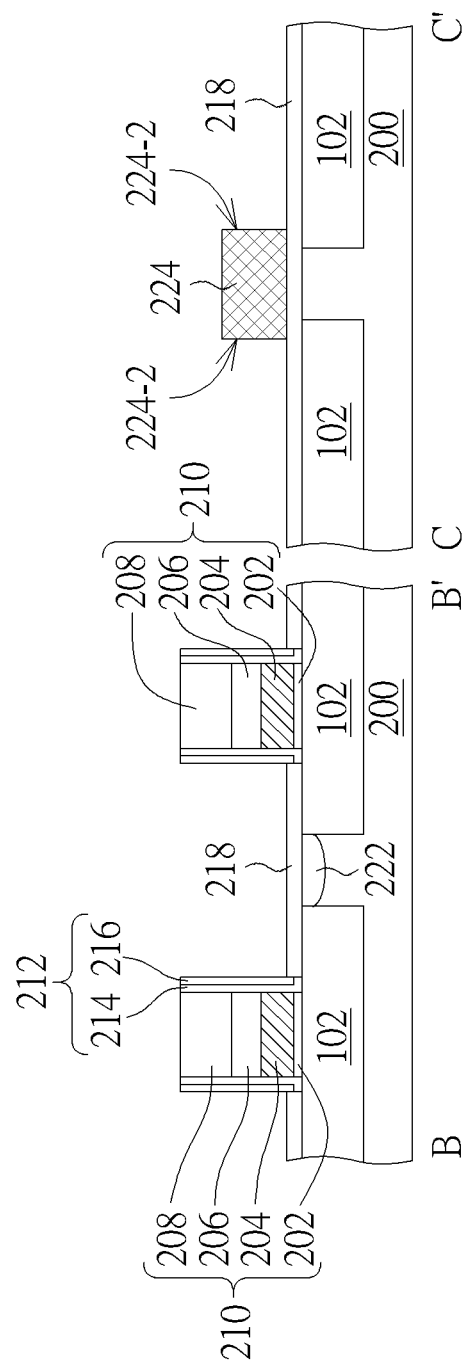
FIG. 4 is a schematic cross-sectional view taken along line B-B' and line C-C' of FIG. 3 at a stage of a method for fabricating a non-volatile memory device according to some embodiments of the present disclosure.

FIG. 4 is a schematic cross-sectional view taken along line B-B' and line C-C' of FIG. 3 at a stage of a method for fabricating a non-volatile memory device according to some embodiments of the present disclosure. The views BB' and CC' of FIG. 4 and the view AA' of FIG. 2 are at the same manufacturing stage. Referring to view BB' of FIG. 4, the isolation structures 102 are disposed under the stacked structures 210 respectively, and the source region 222 is defined between two adjacent isolation structures 102. Referring to view CC' of FIG. 4, the isolation structures 102 are disposed at two sides of the floating gate 224, and the active region (not shown) may be defined in the substrate 200 between two adjacent isolation structures 102.

Figure 5:
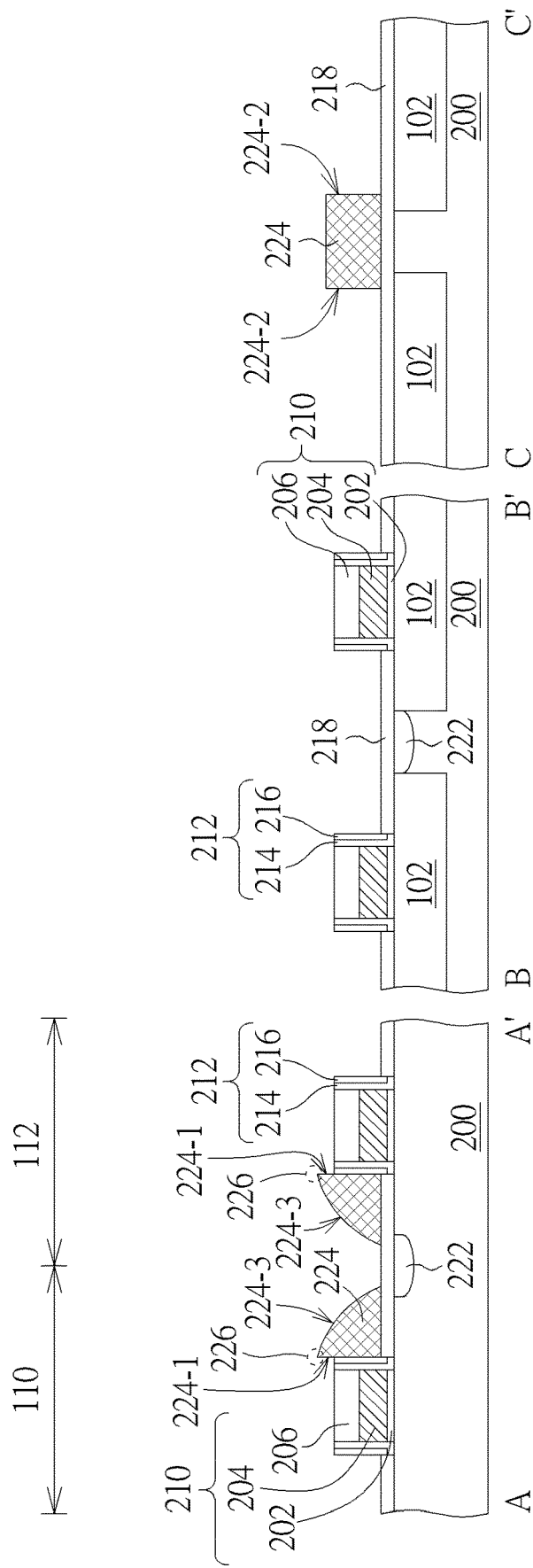
FIG. 5 is a schematic cross-sectional view taken along line A-A', line B-B' and line C-C' of FIG. 3 at a manufacturing stage subsequent to FIG. 4 according to some embodiments of the present disclosure, where an uppermost edge of a floating gate is higher than a top surface of a stacked structure.

FIG. 5 is a schematic cross-sectional view taken along line A-A', line B-B' and line C-C' of FIG. 3 at a manufacturing stage subsequent to FIG. 4 according to some embodiments of the present disclosure, where an uppermost edge of a floating gate is higher than a top surface of a stacked structure. Referring to FIG. 5, especially the view AA' of FIG. 5, the sacrificial layer 208 in each stacked structure 210 is removed completely until a top surface of the insulation layer 206 is exposed. During removing the sacrificial layer 208, a portion of the insulation layer 206 may be removed slightly. Besides, a portion of the isolation material layer 212 disposed between the stacked structure 210 and the floating gate 224 can be removed. The method of removing the sacrificial layer 208 and a portion of the insulation layer 206 is, for instance, a wet etching method or a dry etching method, but not limited thereto. By applying the abovementioned etching process, the uppermost edge 226 of the floating gate 224 is higher than the top surface of the insulation layer 206, and a portion of the inner sidewall 224-1 of the floating gate 224 can be exposed.

Figure 6:
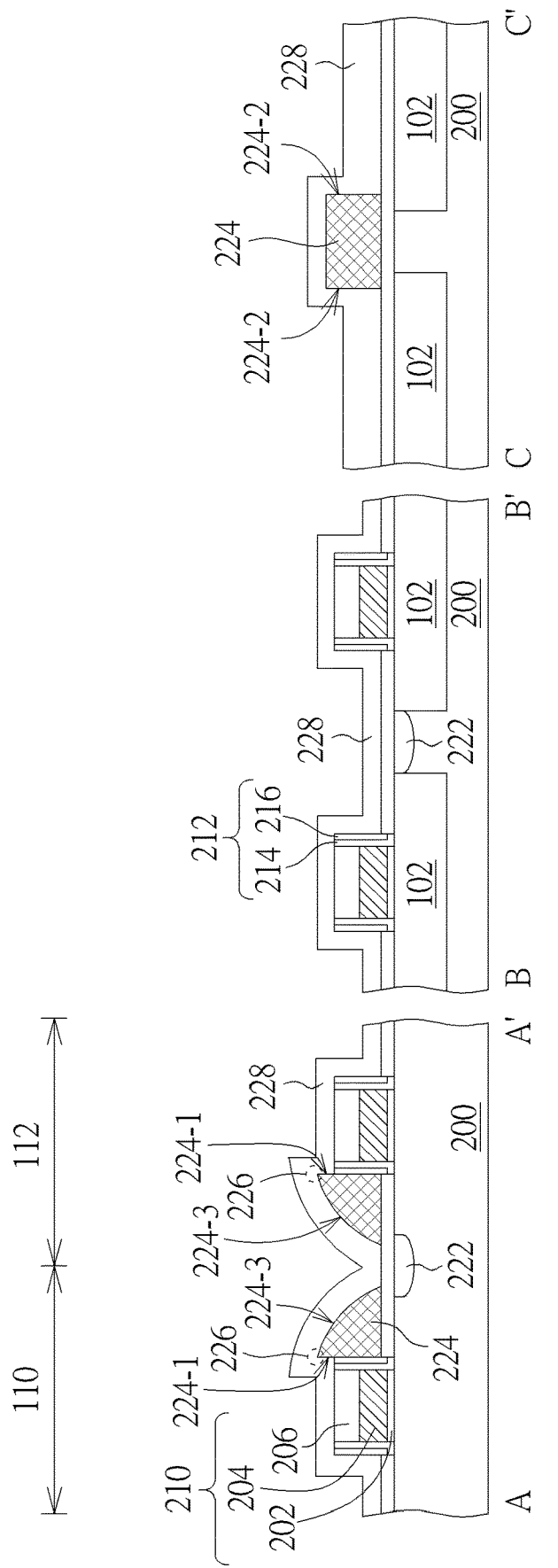
FIG. 6 is a schematic cross-sectional view taken along line A-A', line B-B' and line C-C' of FIG. 3 at a manufacturing stage subsequent to FIG. 5 according to some embodiments of the present disclosure, where an uppermost edge of a floating gate is covered with a dielectric material layer.

FIG. 6 is a schematic cross-sectional view taken along line A-A', line B-B' and line C-C' of FIG. 3 at a manufacturing stage subsequent to FIG. 5 according to some embodiments of the present disclosure, where an uppermost edge of a floating gate is covered with a dielectric material layer. Referring to FIG. 6, a dielectric material layer 228 is formed on the substrate 200 to cover the inner sidewall 224-1, the lateral sidewall 224-2, and the curved sidewall 224-3 of the floating gate 224 after etching the stacked structure 210 as described in FIG. 5. Referring to view AA' of FIG. 6, a portion of the inner sidewall 224-1 of the floating gate 224 is in direct contact with the dielectric material layer 228. According to some embodiments of the present disclosure, the dielectric material layer 228 is a conformal layer that conforms to the shapes of the layers under the dielectric material layer 228. The material of the dielectric material layer 228 is, for instance, silicon oxide or other insulating material, and the forming method thereof is, for instance, a chemical vapor deposition method or other blanket deposition methods, but not limited thereto.

Figure 7:
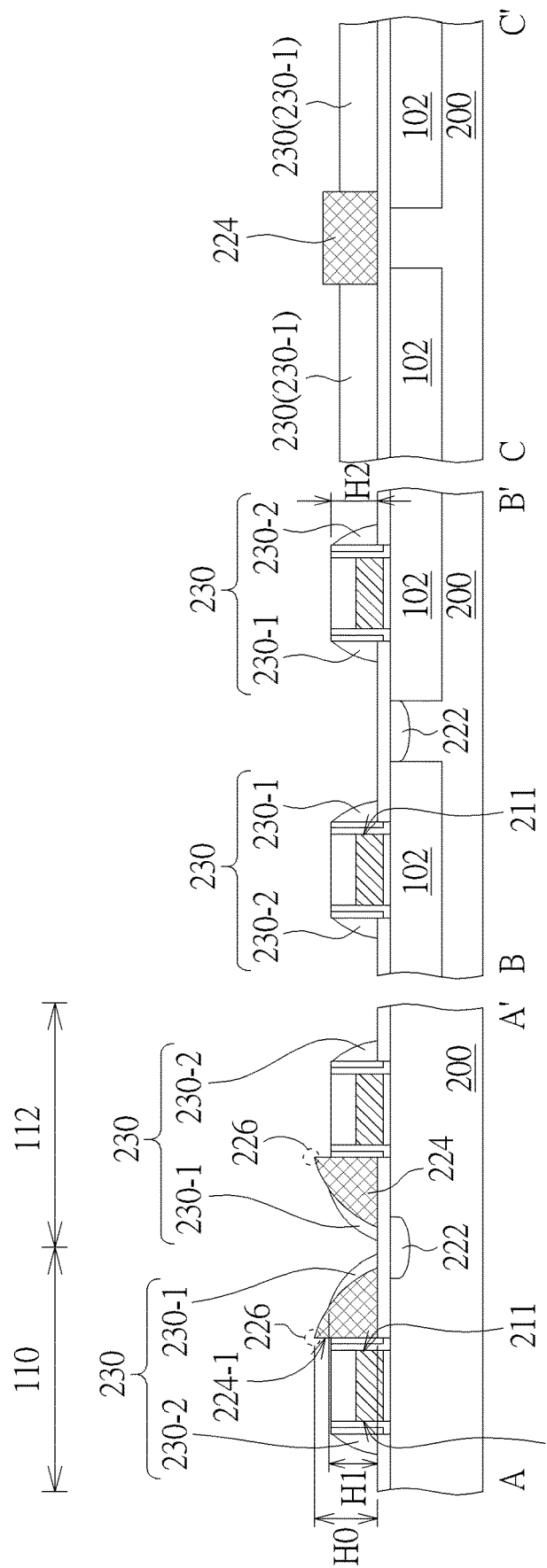
FIG. 7 is a schematic cross-sectional view taken along line A-A', line B-B' and line C-C' of FIG. 3 at a manufacturing stage subsequent to FIG. 6 according to some embodiments of the present disclosure, where the sidewalls of a floating gate are covered with an etched dielectric material layer.

FIG. 7 is a schematic cross-sectional view taken along line A-A', line B-B' and line C-C' of FIG. 3 at a manufacturing stage subsequent to FIG. 6 according to some embodiments of the present disclosure, where the sidewalls of a floating gate are covered with an etched dielectric material layer. Referring to FIG. 7, the dielectric material layer 228 is etched to form an etched dielectric material layer 230 including a first portion 230-1 and a second portion 230-2. By etching the dielectric material layer 228, the uppermost edge 226 of the floating gate 224 and a portion of the inner sidewall 224-1 of the floating gate 224 can be exposed from the dielectric etched material layer 230.

The first portion 230-1 and second portion 230-2 of the etched dielectric material layer 230 are spacer-shaped structures and can be respectively disposed on opposite sides of each of the stacked structures 210. For instance, the first portion 230-1 of the etched dielectric material layer 230 can be disposed at a first side of each of the stacked structures 210 so that the first portion 230-1 can cover both the first sidewall 211 of the stacked structure 210 and the curved sidewall 224-3 of the floating gate 224. Besides, the second portion 230-2 of the etched dielectric material layer 230 can be disposed at an opposite side (or second side) of each of the stacked structures 210 so that the second portion 230-2 can cover the second sidewall 213 of the stacked structure 210. Referring to view AA' of FIG. 7, the height H0 of the floating gate 224 is higher than the height H1 of the first portion 230-1 of the etched dielectric material layer 230. Besides, referring to views AA' and BB' of FIG. 7, the height H1 of the first portion 230-1 of the etched dielectric material layer 230 disposed on the curved sidewall 224-3 of the floating gate 224 may be the same as or different from the height H2 of the first portion 230-1 of the etched dielectric material layer 230 disposed on the first sidewall 211 of the stacked structure based on different requirements.

Figure 8:
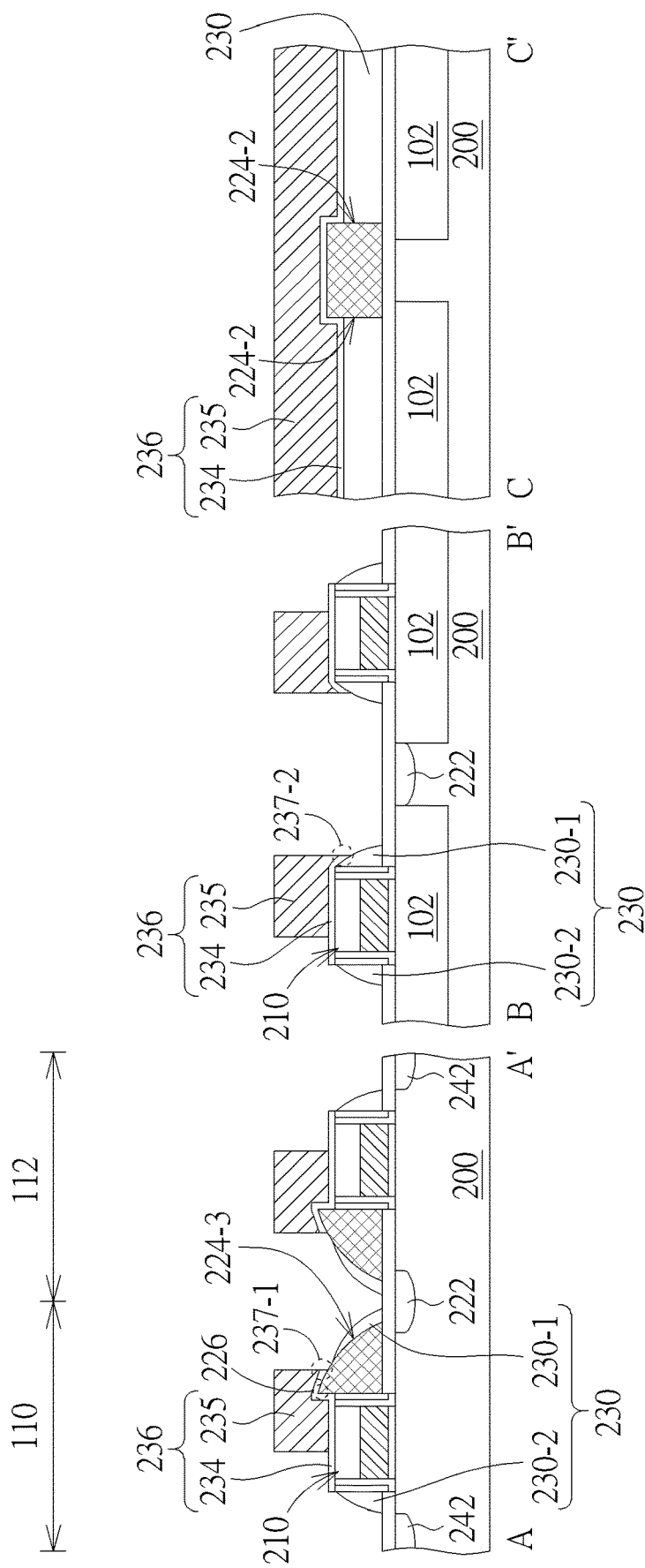
FIG. 8 is a schematic cross-sectional view taken along line A-A', line B-B' and line C-C' of FIG. 3 at a manufacturing stage subsequent to FIG. 7 according to some embodiments of the present disclosure, where an uppermost edge of a floating gate is covered with an upper gate structure.

FIG. 8 is a schematic cross-sectional view taken along line A-A', line B-B' and line C-C' of FIG. 3 at a manufacturing stage subsequent to FIG. 7 according to some embodiments of the present disclosure, where an uppermost edge of a floating gate is covered with an upper gate structure. Referring to FIG. 8, at least one drain region, such as two drain regions 242, may be formed at sides of the stacked structures 210. The drain regions 242 are disposed in the first memory cell region 110 and the second memory cell region 112 respectively, which can be electrically coupled to each other through vias or contacts in the subsequent manufacturing processes. According to some embodiments of the present disclosure, the drain regions 242 can also be formed before forming the dielectric material layer 228 rather than after forming the etched dielectric material layer 230. The forming method of the drain region 242 includes, for instance, performing an ion implantation process. The implanted dopant can be an n-type or p-type dopant as decided according to the design of the device. The dopants and the doping concentrations of the source region 222 and the drain region 242 can be the same and can also be different.

Then, referring to view AA' of FIG. 8, at least one upper gate structure, such as two upper gate structures 236, is formed on the top surface of each of the stacked structures 210. The upper gate structures 236 and the stacked structures 210 can extend along the same direction, such as a y-direction, when viewed from a top-down perspective, and the upper gate structures 236 can be disposed in the first memory cell region 110 and the second memory cell region 112 respectively. The upper gate structures 236 can be a stacked structure including an upper gate dielectric layer 234 and an upper gate electrode, which can act as an erase gate or as both an erase gate and a control gate depending on actual requirements.

A width of the upper gate structure 236 is determined independent of a width of the assist gate 204 so that the width of the upper gate structure 236 may be equal to, smaller than, or larger than the width of the assist gate 204. A portion of the upper gate structure 236 laterally overlaps with the floating gate 224 so that the upper edge 236, a portion of the inner sidewall 224-1, and a portion of the curved sidewall 224-3 of the floating gate 224 can be covered with the upper gate structure 236. Besides, outer surfaces of the first and second portions 230-1, 230-2 of the etched dielectric material layer 230 are lower than a bottom edge 237-1 of the upper gate structure 236, and the first and second portions 230-1, 230-2 of the etched dielectric material layer 230 are spaced apart from the sidewalls of the upper gate structure 235.

The material of the upper gate dielectric layer 234 is, for instance, silicon oxide or silicon oxynitride. The forming method of the upper gate dielectric layer 234 is, for instance, a chemical vapor deposition method. The forming method of the upper gate 235 is as follows: a conductive layer (not shown) is formed on the substrate 200, and then the conductive layer is patterned. The material of the conductive layer is, for instance, doped polysilicon or polycide. When the material of the conductive layer is doped polysilicon, the forming method thereof includes, for instance, performing an ion implantation step after an undoped polysilicon layer is formed via a chemical vapor deposition method; or performing a chemical vapor deposition method with an in-situ dopant implantation method. The method of patterning the conductive layer includes, for instance, a photolithography process and an etching process.

Referring to view BB' of FIG. 8, the portion of the upper gate structure 236 disposed over the isolation structure 102 covers the first portion 230-1 of the etched dielectric material layer 230. In other words, the first portion 230-1 of the etched dielectric material layer 230 can be disposed between the upper gate structure 236 and the substrate 200. Besides, the bottom edge 237-2 of the upper gate structure 236 disposed over the isolation structure 102 is lower than the top surface of the stacked structure 210.

Referring to view CC' of FIG. 8, an upper portion of the lateral sidewall 224-2 of the floating gate 224 can be covered with the upper gate structure 236, and an lower portion of the lateral sidewall 224-2 of the floating gate 224 can be covered with the etched dielectric material layer 230. Because of the existence of the etched dielectric material layer 230, a bottom surface of the upper gate structure 236 extending beyond the lateral sidewall 224-2 of the floating gate 224 is spaced apart from the tunneling dielectric layer 218.

When the manufacturing stage of FIG. 8 is complete, a non-volatile memory cell including three gate electrodes is obtained, which includes the assist gate 204, the floating gate 224, and the upper gate 235. In this case, the etched dielectric material layer 230 is made of insulating material rather than conductive material in order to avoid unnecessary electrical connection. Specifically, the assist gate 204 can act as a word line used to turn on/off the carrier channel under the assist gate 204. The floating gate 224 can be used to store or trap electron and thus determine the states of the memory cell, such as state "1" or state "0". The upper gate structure 236 can act as not only a control gate to make hot electron tunnel from the carrier channel into the floating gate 224 but also an erase gate to remove the electron stored in the floating gate 224.

According to the structure shown in FIG. 8, since the etched dielectric material layer 230 is disposed on the lateral sidewall of the floating gate 224, a bottom surface of the upper gate structure 236 extending beyond the lateral sidewall 224-2 of the floating gate 224 is spaced apart from the tunneling dielectric layer 218. By forming the etched dielectric material layer 230, the overlapping area between the upper gate structure 236 and the lateral sidewall 224-2 of the floating gate 224 is reduced, which means that the coupling capacitance between the upper gate structure 236 and the floating gate 224 can be reduced accordingly. During an erase operation, since the electron stored in the floating gate 224 mainly tunnel from the uppermost edge 226 of the floating gate 224 into the upper gate structure 236, the reduced overlapping area between the upper gate structure 236 and the lateral sidewall 224-2 of the floating gate 224 can effectively facilitate the erase efficiency and reduce required erase voltage.

In the following paragraphs, several alternative embodiments of the present disclosure are further described, and only the main differences between these embodiments are described for the sake of brevity.

Figure 9:
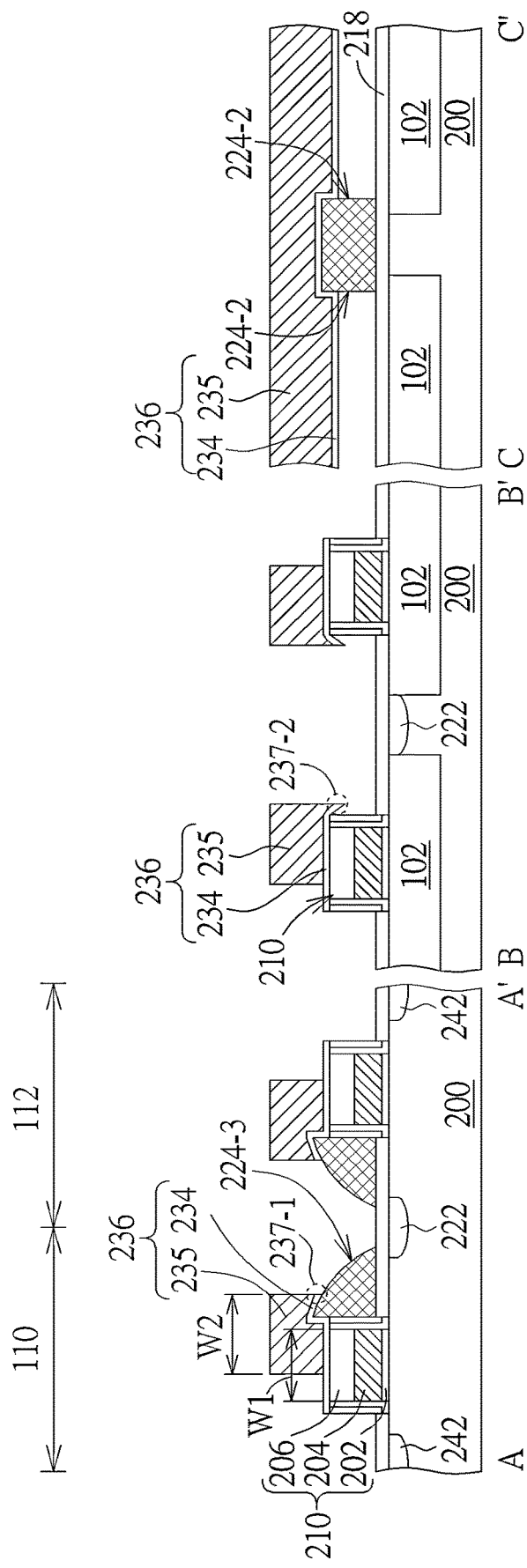
FIG. 9 is a schematic cross-sectional view taken along line A-A', line B-B' and line C-C' of FIG. 3 at a manufacturing stage subsequent to FIG. 8 according to some embodiments of the present disclosure, where spacers are removed to expose the sidewalls of a floating gate.

FIG. 9 is a schematic cross-sectional view taken along line A-A', line B-B' and line C-C' of FIG. 3 at a manufacturing stage subsequent to FIG. 8 according to some embodiments of the present disclosure, where spacers are removed to expose the sidewalls of a floating gate. Referring to view AA' of FIG. 9, the etched dielectric material layer 230 is further removed so that the curved sidewall 224-3 of the floating gate 224 is no longer covered with the etched dielectric material layer 230. A width W2 of the upper gate 235 is smaller than a width W1 of the assist gate 204. Referring to view CC' of FIG. 9, the bottom surface of the upper gate structure 236 extending beyond the lateral sidewall 224-2 of the floating gate 224 is exposed and suspended over the tunneling dielectric layer 218.

Figure 10:
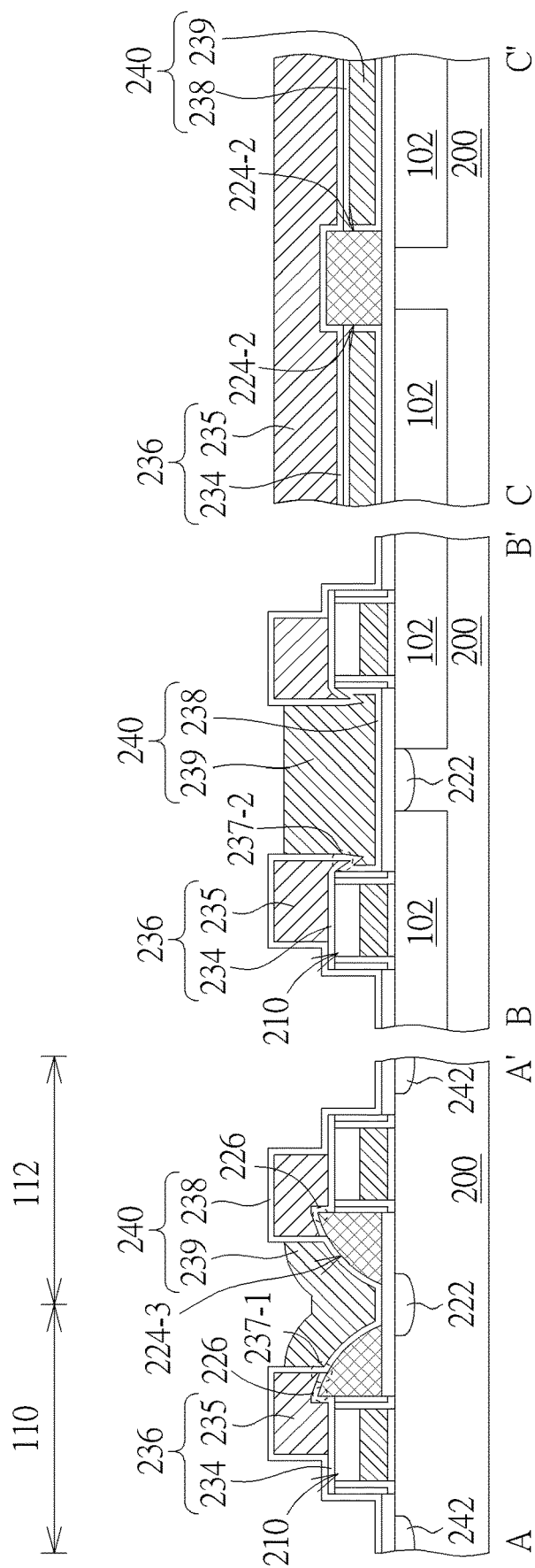
FIG. 10 is a schematic cross-sectional view taken along line A-A', line B-B' and line C-C' of FIG. 3 at a manufacturing stage subsequent to FIG. 9 according to some embodiments of the present disclosure, where the sidewalls of a floating gate is covered with a middle gate structure.

FIG. 10 is a schematic cross-sectional view taken along line A-A', line B-B' and line C-C' of FIG. 3 at a manufacturing stage subsequent to FIG. 9 according to some embodiments of the present disclosure, where the sidewalls of a floating gate is covered with a middle gate structure. Referring to view AA' of FIG. 10, a middle gate structure 240 is formed on the floating gate 224 after forming the upper gate structure 236, and the curved sidewall 224-3 of the floating gate 224 is covered with the middle gate structure 240. The middle gate structure 224 is a stacked structure including an inter-gate dielectric 238 and a control gate 239. Referring to view BB' of FIG. 10, the bottom edge 237-2 of the upper gate structure 236 disposed over the isolation structure 102 can be covered with the middle gate structure 240. Referring to view CC' of FIG. 10, a portion of the middle gate structure 240 is disposed between the bottom surface of the upper gate structure 236 and the substrate 200. Thus, the inter-gate dielectric 238 is continuously disposed on the bottom surface of the upper gate structure 234 and the lateral sidewall 224-2 of the floating gate 224.

The material of the inter-gate dielectric 238 includes silicon oxide/silicon nitride/silicon oxide. The forming method of the inter-gate dielectric 238 includes, for instance, forming a silicon oxide layer, a silicon nitride layer, and another silicon oxide layer in order using a chemical vapor deposition method. The material of the inter-gate dielectric layer 238 can also be silicon nitride/silicon oxide or other high-dielectric constant materials (k>4). The material of the control gate 239 is, for instance, doped polysilicon or polycide. The forming method of the control gate 239 includes, for instance, first forming a conductive layer (not shown) on the substrate, and then patterning the conductive layer to form the control gate 239. The forming method of the conductive layer is, for instance, a chemical vapor deposition method.

When the manufacturing stage of FIG. 10 is complete, a non-volatile memory cell including four gate electrodes is obtained, which includes the assist gate 204, the floating gate 224, the upper gate 235, and the middle gate 240. Analogously, the functions of the assist gate 204 and the floating gate 224 are the same as those of FIG. 8. However, the upper gate 236 in this embodiment can only act as an erase gate to remove the electron stored in the floating gate 224. The middle gate 240 in this embodiment can be a control gate shared by two adjacent memory cells and can make hot electron tunnel from the carrier channel into the floating gate 224 of the selected cell.

According to the structure shown in FIG. 10, the bottom surface of the upper gate structure 236 extending beyond the lateral sidewall 224-2 of the floating gate 224 is spaced apart from the tunneling dielectric layer 218. The overlapping area between the upper gate structure 236 and the lateral sidewall 224-2 of the floating gate 224 is reduced, and the overlapping area between the middle gate structure 236 and the lateral sidewall 224-2 of the floating gate 224 is increased.

As a result, the coupling capacitance between the upper gate structure 236 and the floating gate 224 can be reduced, which means that the erase efficiency can be enhanced in an erase operation. Besides, the coupling capacitance between the middle gate structure 236 and the floating gate 224 is increased, which means that the programming efficiency can also be enhanced in programming operation.

Figure 11:
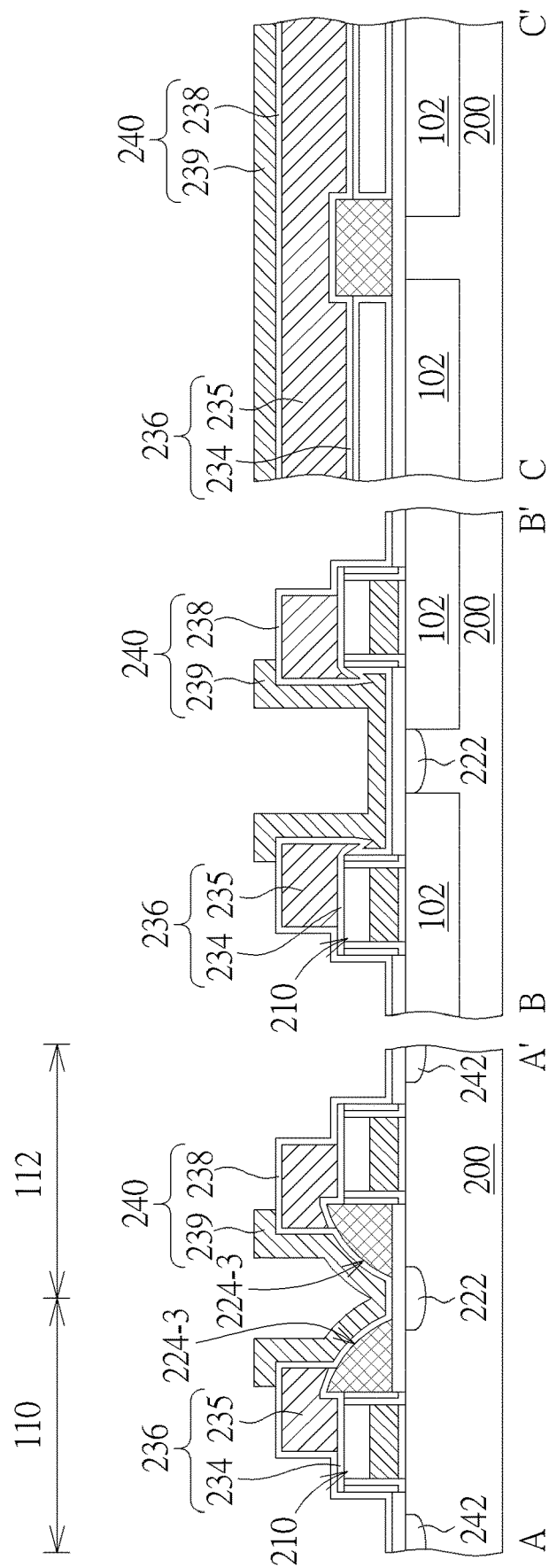
FIG. 11 is a schematic cross-sectional view taken along line A-A', line B-B' and line C-C' of FIG. 3 at a manufacturing stage subsequent to FIG. 9 according to alternative embodiments of the present disclosure, where the sidewalls of a floating gate is covered with a middle gate structure.

FIG. 11 is a schematic cross-sectional view taken along line A-A', line B-B' and line C-C' of FIG. 3 at a manufacturing stage subsequent to FIG. 9 according to alternative embodiments of the present disclosure, where the sidewalls of a floating gate is covered with a middle gate structure. The structure shown in FIG. 11 is analogous to the structure shown in FIG. 10, the main difference is that the control gate 239 of the middle gate structure 240 is relatively thin and can cover not only the curved sidewall 224-3 of the floating gate 224 but also a top surface of the upper gate structure 236.

Figure 12:
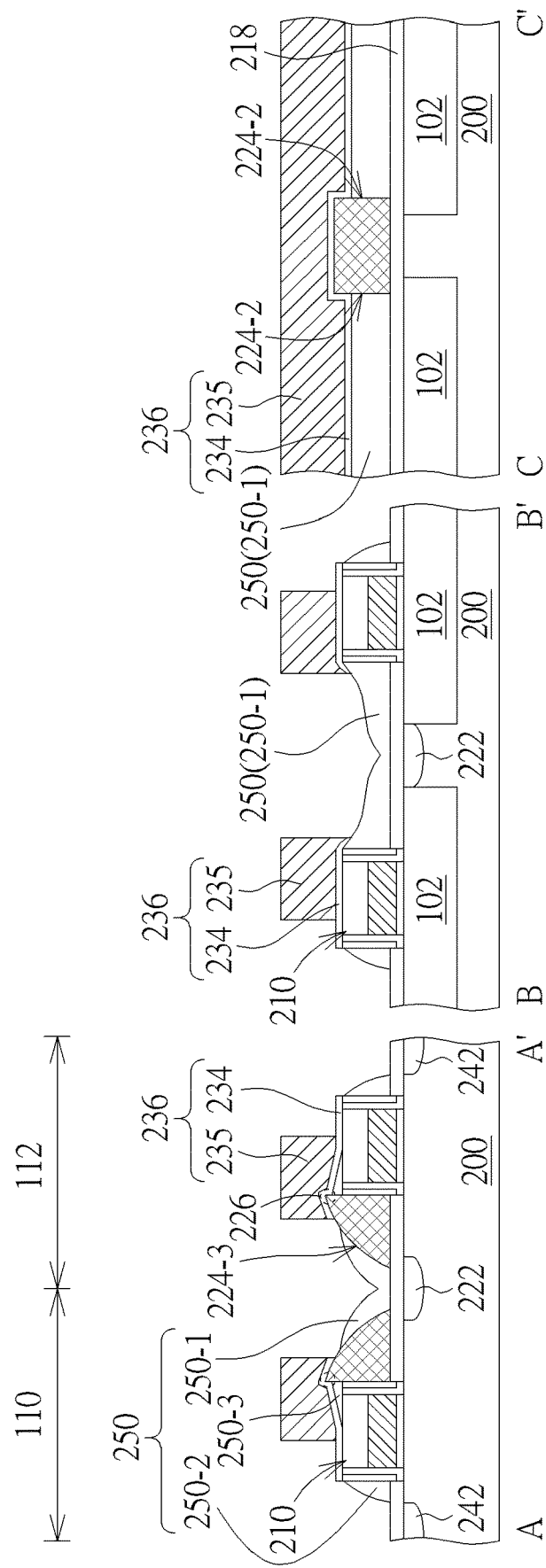
FIG. 12 is a schematic cross-sectional view taken along line A-A', line B-B' and line C-C' of FIG. 3 at a manufacturing stage subsequent to FIG. 6 according to alternative embodiments of the present disclosure, where a residual spacer is disposed between an upper gate structure and a stacked structure.

FIG. 12 is a schematic cross-sectional view taken along line A-A', line B-B' and line C-C' of FIG. 3 at a manufacturing stage subsequent to FIG. 6 according to alternative embodiments of the present disclosure, where a residual spacer is disposed between an upper gate structure and a stacked structure. The structure shown in FIG. 12 is analogous to the structure shown in FIG. 8, the main difference is that an etched dielectric material layer 250 including a residual spacer, such as a third portion 250-3, is formed by etching the material layer 228. Referring to view AA' of FIG. 12, the etched dielectric material layer 250 includes at least a first portion 250-1 connected between the sidewalls of the opposite-positioned floating gates 224, a second portion 250-2 disposed opposite the first portion 250-1, and the third portion 250-3 disposed between the assist gate 204 and the upper gate structure 236. Referring to view AA' of FIG. 12, the third portion 250-3 of the etched dielectric material layer 250 can be in direct contact with the inner sidewall 224-1 of the floating gate 224, but the uppermost edge 226 of the floating gate 224 is still higher than the third portion 250-3 of the etched dielectric material layer 250. Thus, during erase operation, the electron stored in the floating gate 224 can tunnel from the uppermost edge 226 of the floating gate 224 into the upper gate structure 236 even though the third portion 250-3 of the etched dielectric material layer 250 is disposed between the assist gate 204 and the upper gate structure 236.

Figure 13:
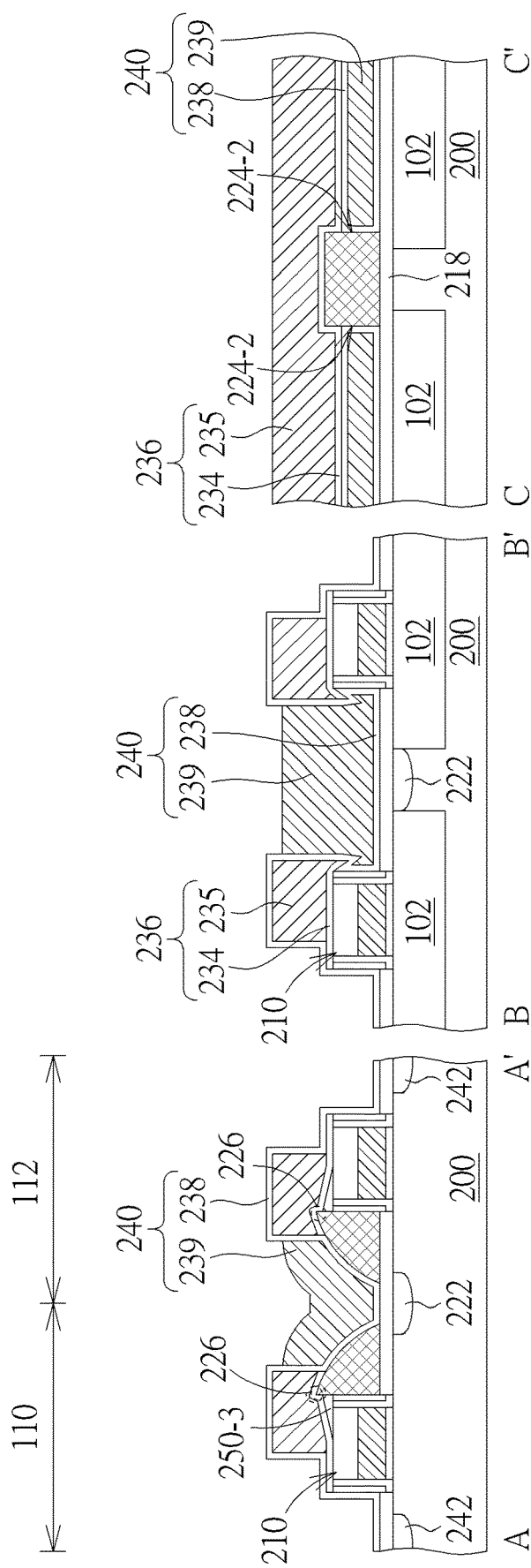
FIG. 13 is a schematic cross-sectional view taken along line A-A', line B-B' and line C-C' of FIG. 3 at a manufacturing stage subsequent to FIG. 12 according to alternative embodiments of the present disclosure, where the sidewalls of a floating gate is covered with a middle gate structure.

FIG. 13 is a schematic cross-sectional view taken along line A-A', line B-B' and line C-C' of FIG. 3 at a manufacturing stage subsequent to FIG. 12 according to alternative embodiments of the present disclosure, where the sidewalls of a floating gate is covered with a middle gate structure. The structure shown in FIG. 13 is analogous to the structure shown in FIG. 10, the main difference is that an etched dielectric material layer 250 including a residual spacer, such as a third portion 250-3, is formed by etching the material layer 228 so that the third portion 250-3 of the etched dielectric material layer 250 is disposed between the assist gate 204 and the upper gate structure 236. Referring to view AA' of FIG. 13, the third portion 250-3 of the etched dielectric material layer 250 can in direct contact with the inner sidewall 224-1 of the floating gate 224, but the uppermost edge 226 of the floating gate 224 is still higher than the third portion 250-3 of the etched dielectric material layer 250.

Figure 14:
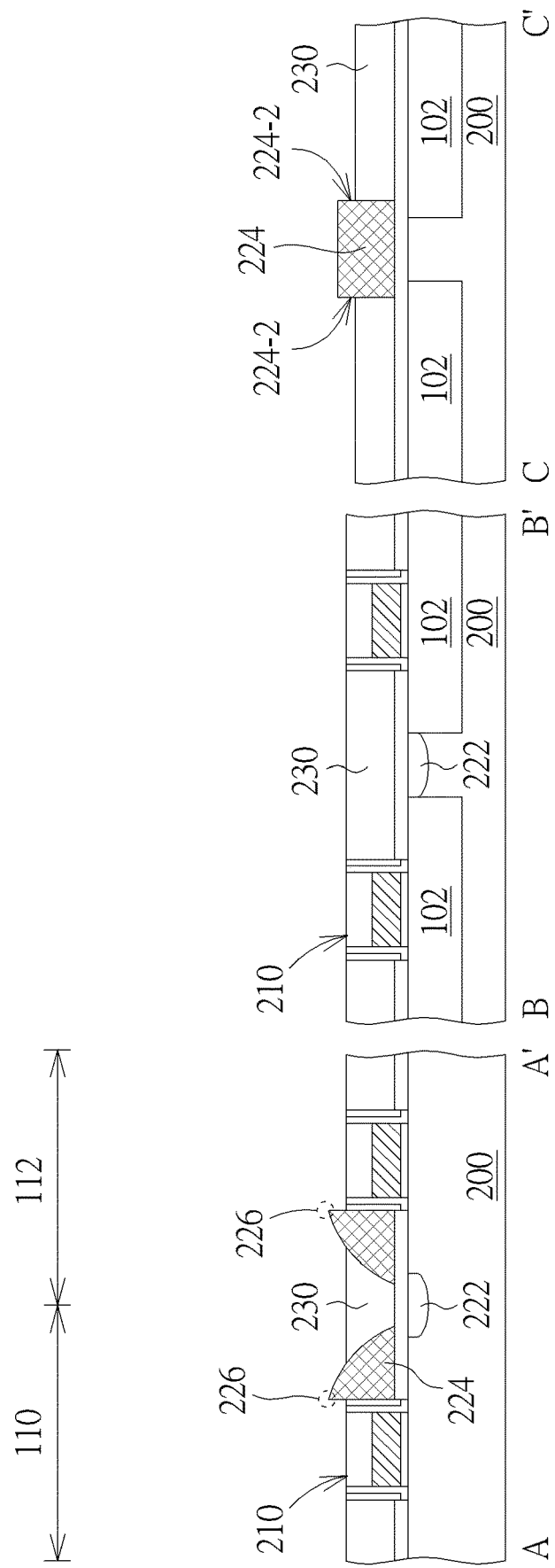
FIG. 14 is a schematic cross-sectional view taken along line A-A', line B-B' and line C-C' of FIG. 3 at a manufacturing stage subsequent to FIG. 5 according to alternative embodiments of the present disclosure, where the sidewalls of a floating gate is covered with a dielectric material layer.

FIG. 14 is a schematic cross-sectional view taken along line A-A', line B-B' and line C-C' of FIG. 3 at a manufacturing stage subsequent to FIG. 5 according to alternative embodiments of the present disclosure, where the sidewalls of a floating gate is covered with a dielectric material layer. Referring to FIG. 14, an etched dielectric material layer 230 with a flat top surface is formed on the substrate 200. An upper portion of the floating gate 224 can protrude from the etched dielectric material layer 230 so that the uppermost edge of the floating gate 224 is not in direct contact with the etched material layer 230. The material of the etched dielectric material layer 230 is, for instance, silicon oxide or other conductive or insulating material. The forming method of the etched dielectric material layer 230 can include blanket depositing a dielectric material layer (not shown) on the substrate 200. Then, the dielectric material layer is planarized to have a flat top surface. Afterwards, the planarized dielectric material layer is etched down to a certain depth to expose the uppermost edge 226 of the floating gate 224 so as to obtain the structure shown in FIG. 14.

Figure 15:
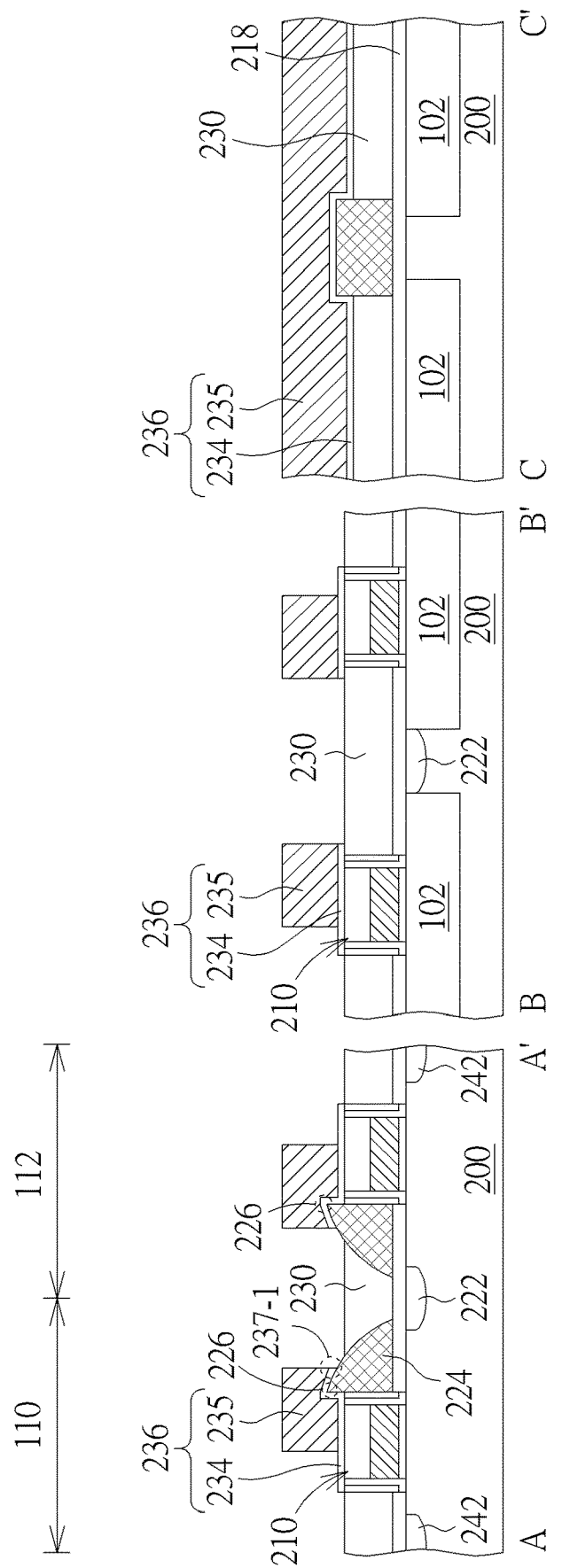
FIG. 15 is a schematic cross-sectional view taken along line A-A', line B-B' and line C-C' of FIG. 3 at a manufacturing stage subsequent to FIG. 14 according to alternative embodiments of the present disclosure, where an uppermost edge of a floating gate is covered with an upper gate structure.

FIG. 15 is a schematic cross-sectional view taken along line A-A', line B-B' and line C-C' of FIG. 3 at a manufacturing stage subsequent to FIG. 14 according to alternative embodiments of the present disclosure, where an uppermost edge of a floating gate is covered with an upper gate structure. The structure shown in FIG. 15 is analogous to the structure shown in FIG. 8, the main difference is that the etched dielectric material layer 230 has a flat top surface. Besides, referring to view BB' of FIG. 15, the bottom edge of the upper gate structure 236 is coplanar with, instead of lower than, the top surface of the stacked structure 210.

Figure 16:
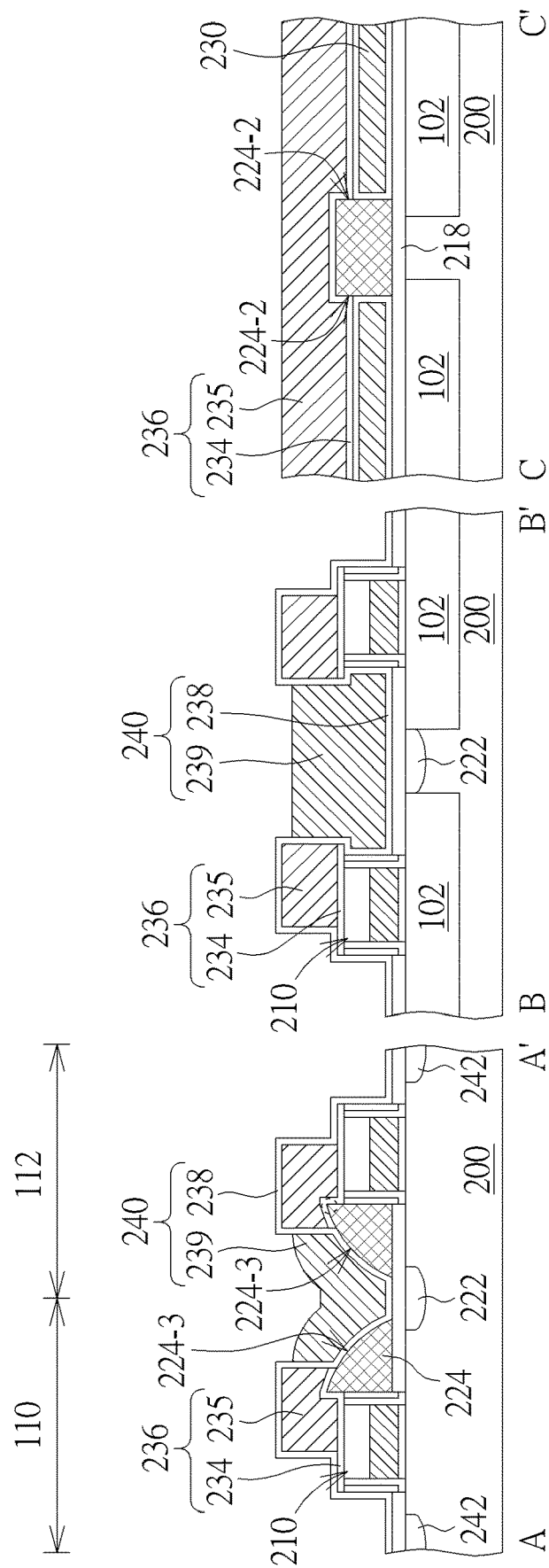
FIG. 16 is a schematic cross-sectional view taken along line A-A', line B-B' and line C-C' of FIG. 3 at a manufacturing stage subsequent to FIG. 15 according to some embodiments of the present disclosure, where the sidewalls of a floating gate is covered with a middle gate structure.

FIG. 16 is a schematic cross-sectional view taken along line A-A', line B-B' and line C-C' of FIG. 3 at a manufacturing stage subsequent to FIG. 15 according to some embodiments of the present disclosure, where the sidewalls of a floating gate is covered with a middle gate structure. The structure shown in FIG. 16 is analogous to the structure shown in FIG. 10, the main difference is that, referring to view BB' of FIG. 16, the upper gate structure 236 has a flat bottom surface rather than a curved bottom surface.

According to some embodiments of the present disclosure, a non-volatile memory device fabricated by the above method is provided, and the structure of the non-volatile memory device may be the same as, similar to or derived from the structures respectively shown in FIGS. 8, 10, 11, 12, 13, 15 and 16. The non-volatile memory device includes at least one stacked gate structure disposed on a substrate 200 and including at least the gate dielectric layer 202, the assist gate 204, the insulation layer 206, and the upper gate structures 236 stacked in order. The non-volatile memory device further includes the tunneling dielectric layer 218 disposed on the substrate 200 at one side of the stacked gate structure. The non-volatile memory device further includes at least one floating gate 224, which is disposed on the tunneling dielectric layer 218 and includes the uppermost edge 226, the curved sidewall 224-3, and the two lateral sidewalls 224-2. The uppermost edge 226 of the floating gate 224 is embedded in the upper gate structure 236, and the bottom surface of the upper gate structure 236 extending beyond the lateral sidewalls 224-2 of the floating gate 224 is spaced apart from the tunneling dielectric layer 218. In some embodiments, referring to FIGS. 10, 11, 13, 15 and 16, the extra middle gate structure 240 covering the curved sidewall 224-3 of the floating gate 224 may be disposed. The purpose of the middle gate structure 240 is to increase the gate coupling to the floating gate 224 and thereby further optimize the operation of the non-volatile memory device.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of manufacturing a non-volatile memory device, comprising:
   providing a substrate;
   forming at least one stacked structure on the substrate, wherein the at least one stacked structure comprises a gate dielectric layer, an assist gate, an insulation layer, and a sacrificial layer stacked in order;
   forming an isolation material layer on a sidewall of the at least one stacked structure;
   forming a tunneling dielectric layer on the substrate at one side of the at least one stacked structure;
   forming at least one floating gate on a sidewall of the isolation material layer and on the tunneling dielectric layer, wherein the at least one floating gate comprises:
      an inner sidewall facing the sidewall of the isolation material layer;
      a lateral sidewall; and
      a curved sidewall connected to edges of the inner sidewall and the lateral sidewall;
   etching the at least one stacked structure until an uppermost edge of the at least one floating gate is higher than a top surface of the insulation layer;
   forming a dielectric material layer covering the inner sidewall, the lateral sidewall, and the curved sidewall of the at least one floating gate after etching the at least one stacked structure;
   etching the dielectric material layer to form an etched dielectric material layer and expose the uppermost edge of the at least one floating gate; and
   forming at least one upper gate structure on the etched dielectric material layer after etching the dielectric material layer, wherein a portion of the etched dielectric material layer is disposed between the at least one upper gate structure and the substrate, and the portion of the etched dielectric material layer is laterally separated from the assist gate.

2. The method of manufacturing the non-volatile memory device of claim 1, further comprising etching the isolation material layer to expose the inner sidewall of the at least one floating gate during etching the at least one stacked structure.

3. The method of manufacturing the non-volatile memory device of claim 1, wherein a portion of the inner sidewall of the at least one floating gate is in direct contact with the dielectric material layer during forming the dielectric material layer.

4. The method of manufacturing the non-volatile memory device of claim 3, further comprising exposing the portion of the inner sidewall of the at least one floating gate from the dielectric material layer during etching the dielectric material layer.

5. The method of manufacturing the non-volatile memory device of claim 1, wherein the at least one stacked structure comprises the sidewall and another sidewall opposite to the sidewall, and the etched dielectric material layer comprises a first portion and a second portion respectively covering the sidewall and the another sidewall of the at least one stacked structure.

6. The method of manufacturing the non-volatile memory device of claim 5, wherein the first portion of the etched dielectric material layer further covers the curved sidewall of the at least one floating gate.

7. The method of manufacturing the non-volatile memory device of claim 5, wherein a height of the first portion of the etched dielectric material layer is lower than a height of the at least one floating gate.

8. The method of manufacturing the non-volatile memory device of claim 5, wherein outer surfaces of the first and second portions of the etched dielectric material layer are lower than a bottom surface of the at least one upper gate structure.

9. The method of manufacturing the non-volatile memory device of claim 5, wherein the first and second portions of the etched dielectric material layer are spaced apart from sidewalls of the at least one upper gate structure.

10. The method of manufacturing the non-volatile memory device of claim 1, wherein the portion of the etched dielectric material layer disposed between the at least one upper gate structure and the substrate covers the lateral sidewall of the at least one floating gate.

11. The method of manufacturing the non-volatile memory device of claim 1, further comprising:
    planarizing the dielectric material layer before etching the dielectric material layer; and
    forming the etched dielectric material layer with a flat top surface by etching the dielectric material layer.

12. The method of manufacturing the non-volatile memory device of claim 1, wherein the dielectric material layer is a conformal layer.

13. The method of manufacturing the non-volatile memory device of claim 12, wherein the etched dielectric material layer comprises a spacer-shaped structure covering the curved sidewall of the at least one floating gate.

14. The method of manufacturing the non-volatile memory device of claim 1, wherein the at least one upper gate structure comprises an upper gate, and a width of the upper gate is smaller than a width of the assist gate.

15. The method of manufacturing the non-volatile memory device of claim 1, wherein a portion of the etched dielectric material layer is disposed between the assist gate and the at least one upper gate structure.

16. The method of manufacturing the non-volatile memory device of claim 1, further comprising removing the etched dielectric material layer to expose a bottom surface of the at least one upper gate structure.

17. The method of manufacturing the non-volatile memory device of claim 16, further comprising forming a middle gate structure on the at least one floating gate after forming the at least one upper gate structure, wherein a portion of the middle gate structure is disposed between the at least one upper gate structure and the substrate.

18. The method of manufacturing the non-volatile memory device of claim 17, wherein the curved sidewall of the at least one floating gate is covered with the middle gate structure.

19. The method of manufacturing the non-volatile memory device of claim 17, wherein the middle gate structure comprises an inter-gate dielectric and a control gate, and the inter-gate dielectric is continuously disposed on the bottom surface of the at least one upper gate structure and the lateral sidewall of the at least one floating gate.

20. The method of manufacturing the non-volatile memory device of claim 1, further comprising forming a shared source region in the substrate after forming the at least one stacked structure, wherein the at least one stacked structure comprises two stacked structures, the at least one floating gate comprises two floating gates, and the at least one upper gate structure comprises two upper gate structures, wherein the non-volatile memory comprises two memory cells comprising the two stacked structures, the two floating gates, the two upper gate structures and the shared source region, and the two memory cells are mirror symmetric to each other.

* * * * *